United States Patent [19]

Paynting

[11] Patent Number: 4,733,209
[45] Date of Patent: Mar. 22, 1988

[54] CERAMIC SCRAMBLER MODULE

[75] Inventor: Richard J. Paynting, Cumberland, R.I.

[73] Assignee: Augat Inc., Mansfield, Mass.

[21] Appl. No.: 879,285

[22] Filed: Jun. 27, 1986

[51] Int. Cl.$^4$ .................... H01P 1/203; H01P 1/201
[52] U.S. Cl. .................................. 333/205; 333/202; 333/235; 333/246
[58] Field of Search .................... 333/1, 110, 126, 129, 333/134, 202–212, 219, 222, 223, 234, 235, 236, 238, 245, 246, 12

[56] References Cited

U.S. PATENT DOCUMENTS

| | | | |
|---|---|---|---|
| 3,593,225 | 7/1971 | Fisher | 333/205 |
| 3,617,955 | 11/1971 | Masland | 333/204 |
| 4,004,257 | 1/1977 | Geissler | 333/206 X |
| 4,293,830 | 10/1981 | Accatino | 333/161 |
| 4,623,856 | 11/1986 | Bickley et al. | 333/235 X |

Primary Examiner—Marvin L. Nussbaum
Attorney, Agent, or Firm—Weingarten, Schurgin, Gagnebin & Hayes

[57] ABSTRACT

A monolithic signal scrambler comprising a transmission line section formed on a ceramic substrate, including resonant line sections disposed adjacent to the transmission line path on the substrate and selectively energized to cause a predetermined signal loss through the conductive transmission line path according to the resonant frequency of the activated resonant line sections. The scrambler according to one embodiment of the present invention includes 12 resonant line sections, each tuned to approximately coincide at the preferred frequency, whereupon the loss caused by the activated resonant sections adds a significant signal loss through the transmission line path at a particular selected frequency. As a result, when used as part of a TV cable distribution system, selective activation of the scrambler provides effectively complete suppression of a selected premium signal channel while maintaining accurate control of the signal attenuation characteristics in the process. Two embodiments are shown, wherein the first is an active circuit, and the second is a passive, hermetically packaged filter to be installed in the line of a TV cable distribution system between the standard four-post tap and the subscriber's TV set.

9 Claims, 6 Drawing Figures

CERAMIC SCRAMBLER MODULE

FIELD OF THE INVENTION

The present invention relates to cable distribution security systems, and in particular, cable distribution security systems including transmission line filters.

BACKGROUND OF THE INVENTION

Cable signal distribution systems require the distribution of many channels of signals with precise control of the characteristics for each channel within specified limits, as well as the selected inhibition of one or more of those signal channels. The problems of such wideband signal distribution, while formidable in themselves, are further exascerbated by the requirements to selectively inhibit or scramble premium security channels. Each channel control must necessarily be limited to the specific channel to be deleted, while preventing the effect of the deletion or distortion of the channel to the adjacent channels or subscriber positions.

Restricted access to signals is effectively provided either by their complete removal or encoding or scrambling so as to render them unintelligible for the particular subscriber application. Many of the schemes of encoding require the signal to be encoded at the head end and each subscriber to have a corresponding signal decoder in their home receiver location. Systems so constructed incur costs both of the encoder and of each decoder. Moreover, a signal must include the key necessary to provide the signal decoding in order for the information to be recovered. Such keys may be recovered by unauthorized users to provide unauthorized access to the protected cable signals.

Other means of signal encryption include the addition of jamming signals to obscure the desired signal information. However, the addition of nonbroadcast jamming signals must be carefully controlled to remain within limits of tolerable signal radiation. Moreover, the jamming signal produced easily generates components outside of the desired band of interest, which when mixed with other jamming or broadcast signal components, may produce extraneous signals which produces undesirable interference on other channels, as well as feeding back through the system to other signal subscribers. Furthermore, if the amplitude of the protected cable signal increases, the jamming signal may no longer be sufficientto obscure that signal.

The technique of restricted access to signals by attenuating the signal requires careful attenuation control at the band of interest. If the band of rejection is excessively broad or not properly tuned, it will interfere with the adjacent, wanted signals. Alternately, if the band of rejection is unnecessarily narrow, enough of the protected signal may pass without attenuation to provide a usable signal to the unauthorized user. Furthermore, the precise control of filter circuits to provide selective rejection of cable signals, particularly at the superband (near UHF) cable channels, and above, requires a circuit more precisely adjustable than lumped resonant circuits, which suffer from problems from the drift, mistuning, and mechanical and thermal changes in the elements. Moreover, since the resonant circuits in the higher frequency bands have a limited Q, they cannot achieve the desired rejection necessary to provide adequate signal rejection while avoiding the adjacent channel interface, multiple resonant sections must be cascaded to provide the desired filtering characteristics. This multiple tune circuit structure further aggravates the tuning and stability problems of the filter structure.

SUMMARY OF THE INVENTION

The present invention provides a passive or an active embodiment, wherein each is embodied as either a signal attenuator or a signal scrambler, including precisely controlled and tuned resonant filters acting independently or in concert to provide steady state or selectable signal attenuation. The passive embodiment comprises filter elements providing a fixed response filter. The active embodiment comprises switchable filter elements to provide a selectable filter response. The system is constructed to provide a transmission line-like signal path on a ceramic substrate, whereupon resonant line sections are disposed in close proximity to the signal-bearing path. The resonant line structures are closely coupled to the transmission path. When activated in an active system (or constantly in a passive system), the signal long the signal path becomes highly attenuated at the frequency corresponding to the resonant line frequency. Each resonant line section may have its own individual resonant frequency, or be resonant at the same frequency as one or more other resonant line sections, and be activated (in an active system) alone or in concert with other sections to provide a filter characteristic according to the aggregate notch characteristic of each section.

The structure includes a ceramic substrate, whereupon the transmission path and the resonant sections typically occupy one surface, and a ground plane and control signal paths occupy the opposite surface. The resonant line sections are typically λ/4 sections whereupon the ends of the quarter wave sections are selectively grounded to cause the adjacent path to have a signal loss at the frequency which corresponds to the resonant frequency of the activated resonant line section. The resonant line sections are activated by a PIN diode, controlled by a control circuit, which derives its control signals from the head end office along same path which provides the subscriber signals. In one embodiment of the present invention, a control circuit may be attached to the subsurface of the scrambler, providing a scrambler module which may be used alone or in combination with other modules to provide a cost-effective television distribution security system.

BRIEF DESCRIPTION OF THE DRAWING

These and other features of the present invention will be better understood by reading the following detailed description, taken together with the drawing, wherein.

DETAILED DESCRIPTION OF THE INVENTION

Figure 1:
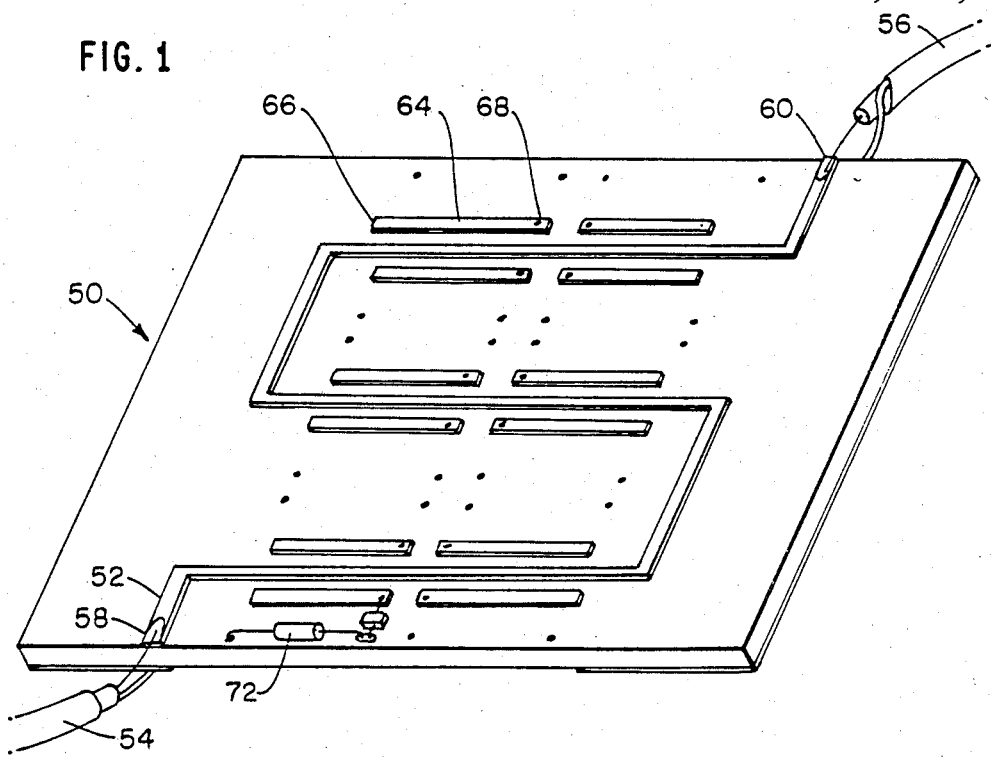
FIG. 1 is a top perspective view of an embodiment of an active ceramic scrambler module.
Figure 2:
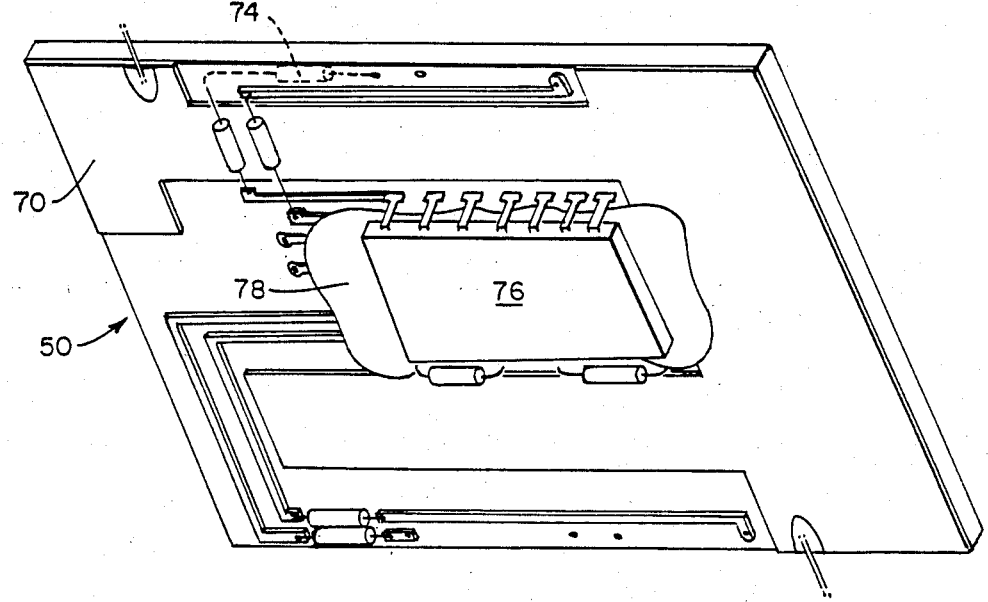
FIG. 2 is a bottom perspective of the module of FIG. 1.

The top and bottom perspective views of the ceramic scrambler module according to the present invention are shown in FIGS. 1 and 2. The conductive signal path 52 is connected between an input signal cable 54 and an output cable 56 at junctions 58 and 60, respectively. The modules according to the present invention have symmetrical input and output connections, and therefore may have the input and output connections interchanged and still provide the filtering action according to the present invention. The signal path 52 is disposed on a ceramic substrate 62 having a thickness typically of 0.020 inches. The path 52 is arranged in a pattern between the input and output connections 58 and 60 to provide sufficient length to allow the resonant elements to be disposed therealong, while maintaining a separation to avoid mutual coupling (and therefore unwanted resonant conditions) between different portions of the path 52. In the embodiment shown in FIG. 1, the path assumes a serpentine route. The scramber module according to the present invention selectively removes energy from the signal path 52 by conductive resonant line sections 64 disposed along either side of the signal path 52, and in close proximity to provide a significant mutual coupling thereto. The number of sections and the dimensions of each section is selectable to provide the desired filter response to be achieved.

Each resonant line section 64 is selectively engaged by activation of a PIN diode switch. In the active state, the signal energy transferred to each resonant line section is dissipated or otherwise caused to be attenuated along the signal path 52, such that the signal available at the output connection 60 has a significant attenuation at the frequency of the active resonant line section. The present embodiment shows a quarter wave resonant line section 64 disposed along both sides of the signal path 52. The resonant line sections 64 are connected to the ground plane 70 on the opposite surface of the ceramic substrate 62, either directly at one end 66 or through the afore-mentioned PIN diode at the opposite end 68. The PIN diode, which may either be disposed on the top surface such as shown at 72 of FIG. 1 or the bottom surface 74 to provide the circuit connections suggested in FIGS. 5 and 6, discussed further below. The ground plane 70 of FIG. 2 covers substantially the entire surface of the substrate 62 underlying the conductive signal path 52 to provide the desired transmission impedance characteristics along that line to allow proper impedance matching to avoid undesired standing waves as a result of impedance mismatching. The ground plane 70 is interrupted to provide area for individual circuit paths to interconnects, such as the activation circuits of each resonant line 64 to a central control element 76. The central control element 76 may also be disposed upon the ceramic substrate 62 and separated from conductive portions of the lower surface by an insulation material, typically an epoxy material 78 which underlies and separates the control circuit 76 from the conductive paths, or the ground plane beneath the epoxy on the lower surface of the substrate. The control circuit 76 typically comprises an integrated circuit which receives control signals originating from the cable head office (not shown) along the same signal path, such as cable 54, which provides the channel signals to the scrambler modules 50.

Figure 3:
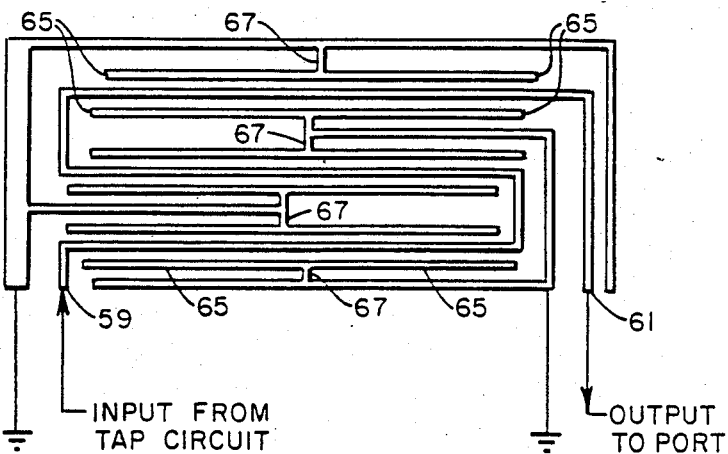
FIG. 3 is a top perspective view of a passive embodiment of the ceramic scrambler module.

The passive embodiment is shown in FIG. 3, wherein the resonant sections 65 are connected to the ground return 67, to provide a filter with a fixed filter response for the path 53 between signal input port 59 and output port 61. As discussed above, the filter resonant sections 65 couple to the signal path conductor 53, selectively absorbing energy therefrom at the resonant frequency of the resonant section.

Figure 4:
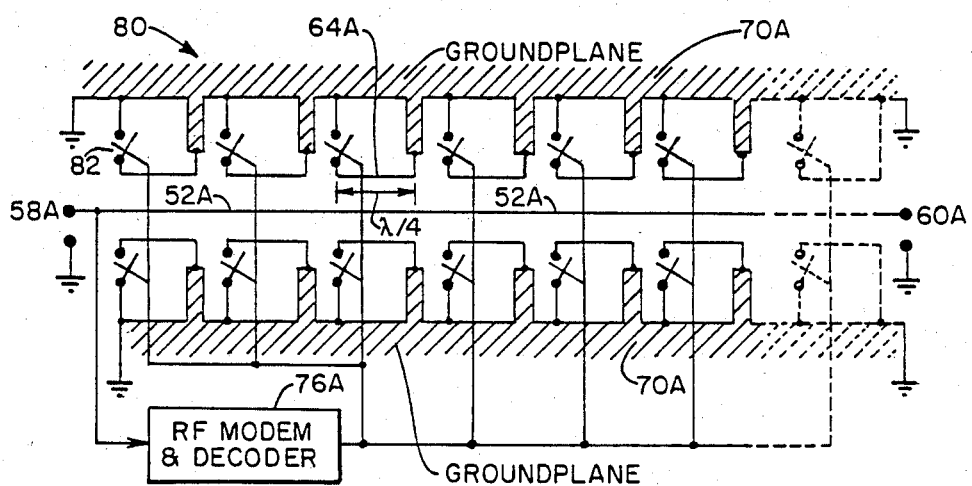
FIG. 4 is a simplified schematic according to the present invention showing the cascading of filters along the transmission path, as shown in FIG. 1.

A simplified shematic diagram of the ceramic scrambler module 50 is shown in FIG. 4. The signal path 52A extends between an input connection 58A and an output connection 60A between selectably energizable resonant line sections 64A, which are activated by connection to the ground plane 70A. The switch elements 84 are connected to the control module 76A, which provides the necessary signal transformation, detection, decoding, and level of transformation required to activate the switches associated with each resonant line section 64A. As is shown in FIG. 4 and discussed previously, the resonant line section 64A are sufficiently close to the signal path 52A to provide significant coupling of the signal long the path 58A to the resonant line section 64A. When the quarter wave resonant line section 64A is open-circuited at one end, and, assuming that the resonant line sections are of sufficient low loss to avoid dissipation of energy on their own, the adjoining (inactive) resonant line section presents no load to the signal line path 58A and no dissipation or attenuation of that signal frequency occurs. However, upon activation (conduction of the switch 84), the resonant line section 64A dissipates the transfer energy, whereupon the path 58A exhibits a significant loss in energy at that frequency. To enhance the rejection characteristic, the circuit of FIG. 4 may include plural filter elements disposed along the signal path 58A, so that a greater attenuation can be achieved. Alternately, the resonant frequencies of each resonant section 64A may be individually selected to achieve a variable pass-band for providing selective attenuation at different channel frequencies.

Figures 5, 6:
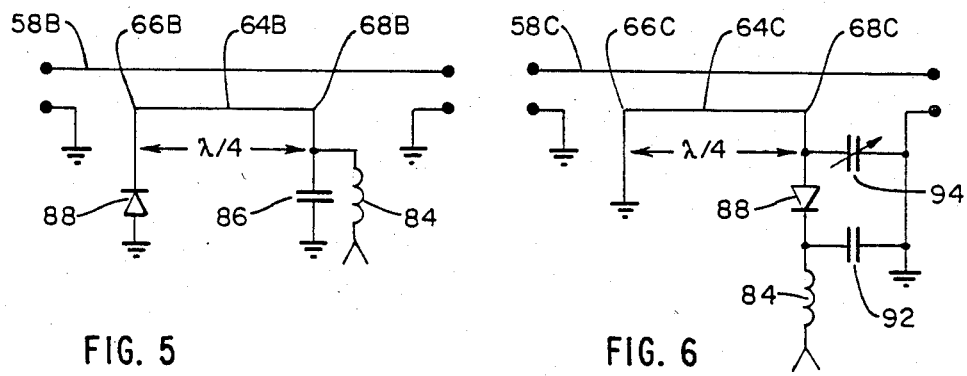
FIG. 5 is a single section schematic of one method of activating the resonant line section of FIGS. 1 and 4.
FIG. 6 is a single section schematic of an alternative embodiment of activating the resonant line section of FIGS. 1 and 3, including a capacitor to retune the resonant line section.

The methods of activation of each resonant line section, shown at 64B in FIG. 5, includes the connection of a PIN diode to ground at one end 66B of the resonant line section 64B, and providing an RF ground at end 68B via capacitor 86. The control signal applied to the diode 88 is applied through conductor 84, which allows the PC or low-frequency PC signal to pass to diode 88 and still provide the RF ground to the end 68B. Alternatively, as shown in FIG. 6, the resonant line section 64C can be activated by directly grounding the end 66C while providing the PIN diode 88 connection to the other end 68C, whereupon the diode is bypassed to ground by capacitor 92 having a control signal received through inductor 84. A further variation to the present invention includes the fine tuning of the resonance of the resonant line section 64C by an additional variable capacitor 94, which is applied to the end 68C of the resonant line section 64C, and ground. The circuits connected according to FIGS. 5 and 6, and other equivalents will provide the desired attenuation along the signal path 58B and 58C when used in conjunction with other resonant line sections as shown in FIG. 4 and implemented according to FIG. 1 to achieve signal attenuation at controllable frequencies having well defined thermal and mechanical properties.

The filter according to the present invention is further unique because it incorporates strip line filter techniques together with a ceramic substrate having a high dielectric constant to reduce the size of the section λ/4. Moreover, the accuracy and stability of the filter λ/4 sections is enhanced by selecting ceramic substrates having controlled temperature expansion coefficients and controlled electrical coefficients (with temperature) wherein the changing coefficients are selected to cancel with a change in temperature.

Variations and substitutions of the circuits and materials according to the present invention made by one skilled in the art are considered within the scope of the present invention, which is not to be limited except according to the claims which follow.

What is claimed is:

1. A signal scrambler, comprising:
   a signal conductor having a plurality of distinct angularly related contiguous subsections disposed on a substrate material including a ground plane, and having an impedance relative to said ground plane and exhibiting a nonresonant transmission characteristic when input signals provide a proper impedance match thereto;
   a plurality of resonant conductors disposed in close proximity to a plurality of said signal conductor subsections for providing significant electrical coupling to said signal conductor, each of said plurality of resonant conductors having a selected resonant frequency; and
   control means disposed on said substrate and being operative to provide an active and a passive state for each of said plurality of resonant conductors, wherein each said resonant conductor in the passive state provides no influence on the transmission characteristics of the signal conductor, and each said resonant conductor in the active state causes a significant transmission loss at the resonant frequency of the active resonant conductor.

2. The signal scrambler of claim 1, wherein
   said plurality of resonant conductors have a different resonant frequency.

3. The signal scrambler of claim 1, further including means for tuning at least one of said resonant conductors.

4. The signal scrambler of claim 1, wherein
   said plurality of resonant conductors are selected to provide an aggregate band-reject function.

5. The signal scrambler of claim 1, wherein
   said resonant conductors are λ/4 wavelength sections at the selected resonant frequency.

6. The signal scrambler of claim 5, wherein
   said resonant conductors include RF grounds at each end when in the active mode, and
   said control means includes an RF switch operable to enable at least one of said RF grounds.

7. The signal scrambler of claim 6, wherein
   said RF switch comprises a diode switch.

8. The signal scrambler of claim 6, wherein
   said control means includes a modem for receiving control signals simultaneously with the signal provided to said signal conductor and for providing an enable signal to said RF switch according to the received control signals.

9. The signal scrambler of claim 1, wherein
   said resonant conductor has a thermal expansion coefficient, said signal scrambler further comprising:
   a substrate retaining said plurality of resonant conductors and having a thermal expansion coefficient and an electrical dielectric coefficient, wherein
   said resonant conductor thermal coefficient, said substrate thermal coefficient, and said substrate electrical dielectric coefficient and selected to cancel changes in electrical characteristics in said signal scrambler caused by changes in temperature.

* * * * *

UNITED STATES PATENT AND TRADEMARK OFFICE
CERTIFICATE OF CORRECTION

PATENT NO. : 4,733,209
DATED : March 22, 1988
INVENTOR(S) : Richard J. Paynting

It is certified that error appears in the above-identified patent and that said Letters Patent is hereby corrected as shown below:

Abstract, last line, "four-post tap" should read --four-port tap--.

Column 1, line 48, "sufficientto" should read --sufficient to--.

Column 2, line 21, "long" should read --along--.

Column 4, line 9, "shematic" should read --schematic--.

Column 4, line 22, "long" should read --along--.

Column 6, line 34, "and selected" should read --are selected--.

Signed and Sealed this

Sixth Day of June, 1989

Attest:

DONALD J. QUIGG

Attesting Officer

Commissioner of Patents and Trademarks